United States Patent [19]

Kohl et al.

[11] Patent Number: 5,575,163
[45] Date of Patent: Nov. 19, 1996

[54] DEVICE FOR THE DETACHABLE FASTENING OF AN ELECTRICAL SERVICE APPLIANCE

[75] Inventors: Peter Köhl, Herborn; Heinz Lûnter, Heuchelheim; Klaus Rinneburger, Wilnsdorf; Manfred Rückert, Hagenbüchach, all of Germany

[73] Assignee: U.S. Philips Corporation, New York, N.Y.

[21] Appl. No.: 178,150

[22] Filed: Jan. 6, 1994

(Under 37 CFR 1.47)

[30] Foreign Application Priority Data

Jan. 14, 1993 [DE] Germany ............... 43 00 734.1

[51] Int. Cl.⁶ ............... E05B 73/00; H04B 1/00
[52] U.S. Cl. ............... 70/58; 248/553; 248/27.3; 455/345; 70/DIG. 49
[58] Field of Search ............... 248/551, 553, 248/273; 70/57, 14, 58, DIG. 49; 455/345

[56] References Cited

U.S. PATENT DOCUMENTS

| | | | |
|---|---|---|---|
| 3,971,237 | 7/1976 | Rasmussen | 70/405 |
| 4,577,818 | 3/1986 | Clarisse | 248/27.3 |
| 4,687,172 | 8/1987 | Stillback | 248/551 |
| 4,784,361 | 11/1988 | Kobayashi et al. | 248/27.3 |
| 4,848,716 | 7/1989 | Nakamoto | 248/27.3 |
| 4,947,661 | 8/1990 | Yoshida | 70/57 |
| 5,077,991 | 1/1992 | Stickel et al. | 70/DIG. 30 |
| 5,152,496 | 10/1992 | Kobayashi | 70/58 |
| 5,216,904 | 6/1993 | Isaki | 70/58 |
| 5,328,288 | 7/1994 | Masuda | 403/329 |
| 5,381,684 | 1/1995 | Kawamura | 70/58 |

FOREIGN PATENT DOCUMENTS

| | | |
|---|---|---|
| 2915333 | 10/1980 | Germany . |
| 2903176 | 12/1983 | Germany . |
| 9206965 | 9/1992 | Germany . |
| 8602891 | 5/1986 | WIPO . |

*Primary Examiner*—Darnell M. Boucher
*Attorney, Agent, or Firm*—Robert J. Kraus

[57] ABSTRACT

A device for the detachable fastening of an electrical service appliance such as a car radio, a CD or cassette player, an amplifier, a traffic control unit, and the like, in an insertion opening wall (12) of a mounting frame (9), which may be the instrument panel of a motor vehicle, which appliance comprises countersupports (20) which grip behind the mounting frame (9) in a mounted state forming a back-locking position in which the appliance has been passed into the insertion opening (10) from the front, and which countersupports can be moved from the back-locking position into a release position for releasing the appliance, wherein the countersupport is formed by a latch (20) which is pivotable about a rotation shaft, which is loaded by a spring (30) in a direction towards the back-locking position, and which comprises a curved edge (42) against which an unlocking key (8) can be passed, which key when passing along the curved edge (42) pivots the latch (20) into the release position against the spring pressure.

11 Claims, 4 Drawing Sheets

DEVICE FOR THE DETACHABLE FASTENING OF AN ELECTRICAL SERVICE APPLIANCE

BACKGROUND OF THE INVENTION

The invention relates to a device for the detachable fastening of an electrical service appliance such as a car radio, a CD or cassette player, an amplifier, a traffic control unit, and the like, in an insertion opening wall of a mounting frame, which may be the instrument panel of a motor vehicle, which appliance comprises countersupports which grip behind the mounting frame in a mounted state, forming a back-locking position in which the appliance has been passed into the insertion opening from the front, and which counter supports can be moved from the back-locking position into a release position for releasing the appliance.

Devices for the detachable fastening of electrical service appliances are known per se. Such a device is described in DE 29 03 176 C2. The countersupports therein are formed by flexible tongues whose free ends form a countersupport in the reverse direction when the appliance has been passed into the insertion opening of the mounting frame and rests with its front part against the front side of the mounting frame wall. The tongue ends have an outwardly directed spring pretension for this purpose and have a tendency to enter the mounting frame wall. By springing out sideways, the spring ends thus form the countersupport which achieves that the appliance is fixed in the insertion opening of the mounting plate.

Pegs are used for loosing the resilient tongues serving as the countersupport, which pegs, when inserted, press the expanded spring ends towards one another such that they are moved into a release position in the region of the insertion opening.

The fastening of the resilient tongues and their arrangement require space which is difficult to provide when the available room becomes increasingly narrower.

SUMMARY OF THE INVENTION

It is an object of the invention to provide a device of the kind mentioned in the opening paragraph which on the one hand has a small constructional volume and which on the other hand also renders unnecessary unattractive holes in the front plate for the pegs to be inserted.

According to the invention, this object is achieved in that the countersupport is formed by a latch which is pivotable about a rotation shaft, which is loaded by a spring in a direction towards the back-locking position, and which comprises a curved edge against which an unlocking key can be passed, which key when passing along the curved edge pivots the latch into the release position against the spring pressure.

It is possible in such a construction to reach the fastening device through the front plate of the appliance between two keys. The fastening device itself is no more than a comparatively small pivotable latch which can be accommodated in a corner behind the front plate.

According to a further embodiment of the invention, the curved edge in the insertion direction merges into a cavity into which the unlocking key which follows the curved edge can enter so as to be held therein. The key thus locks itself to render possible a removal of the service appliance from the mounting frame and also to prevent an inadvertent dropping-out of the key.

According to a further embodiment of the invention, the latch comprises a detent and the unlocking key comprises a security opening for accommodating the detent, the detent and the security opening cooperating in such a manner that the unlocking key is protected by the engaging detent against pulling-out until the latch drops into the back-locking position. The detent with the security opening together ensure that a removal of the key is not possible until after the latch has been pivoted into an end position.

According to a further embodiment of the invention, an operating lever is provided at the latch, which lever acts on a security code switch which can already be moved into the security coding position for the electronics of the appliance during pivoting of the latch. In this manner, the security coding can be activated at the moment the latch is being pivoted. The delay which has existed until now between the discharging of the capacitors and the activation of the security code is thus eliminated.

In a further embodiment of the invention, the spring is a separate steel spring which is supported in a holder cavity of the latch and in an opposed holder.

BRIEF DESCRIPTION OF THE DRAWING

The invention will be described in more detail with reference to the drawing, in which.

DESCRIPTION OF THE PREFERRED EMBODIMENTS

Figure 1:
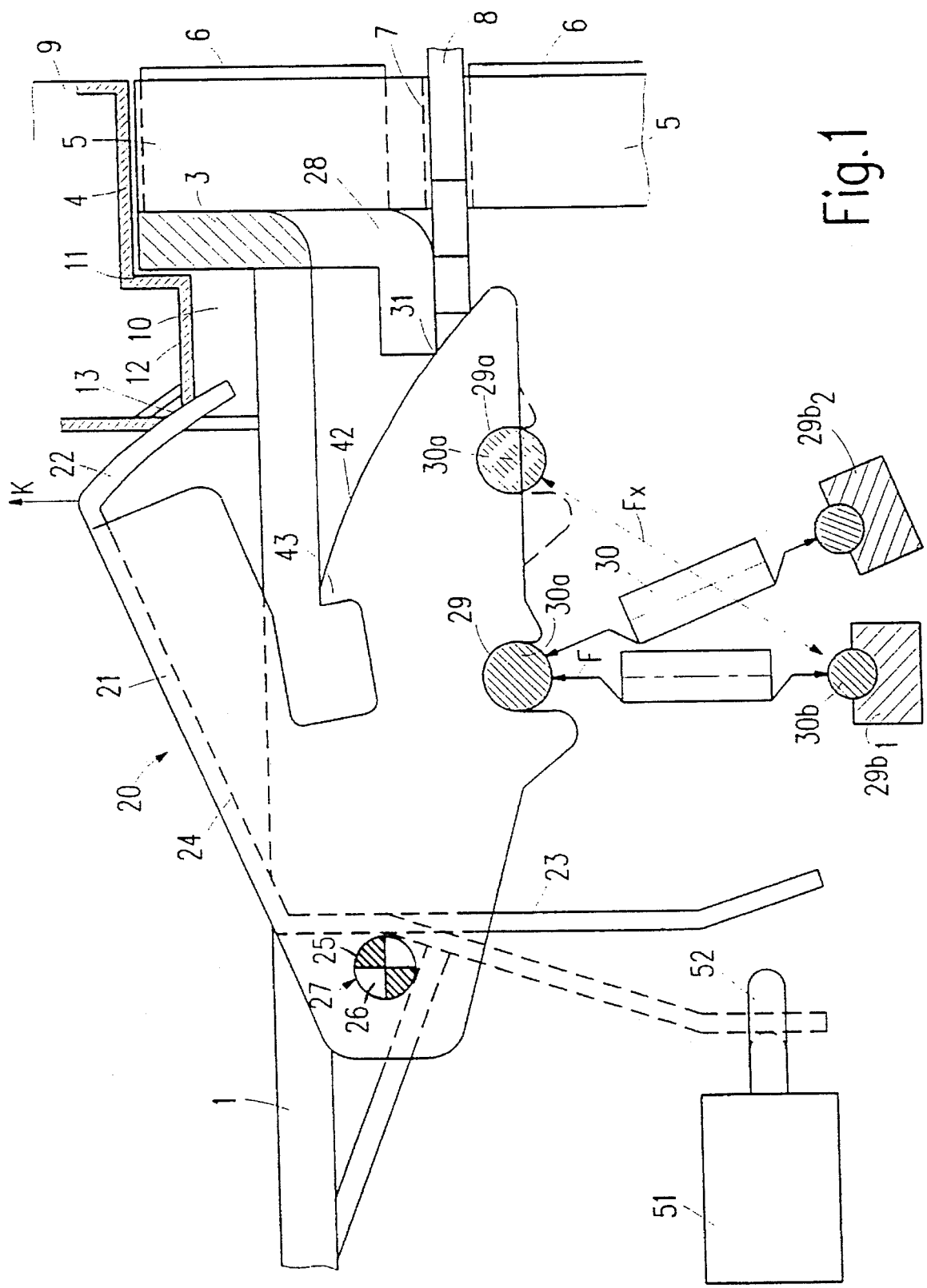
FIG. 1 shows the device according to the invention in the rest or insertion position, in which a latch grips behind a wall of an insertion opening and thus keeps the service appliance clamped in between the front side and rear side of the wall.

FIG. 1 shows a side wall 1 of an electrical service appliance such as a car radio, a CD player, an amplifier, a traffic control unit, or the like. The front edge 3 of the housing side wall is at or near the forward facing portion 4 of the appliance. In this portion, openings 5 are provided for function keys 6 which project in forward direction. Between the openings 5 and the function keys 6, a slot 7 remains into which an unlocking key 8 can be inserted.

In a mounting frame wall 9, for example the instrument panel of a motor vehicle, an insertion opening 10 is provided into which the service appliance can be inserted. When the service appliance has been inserted into the mounting frame wall, it rests with its front edge 3 against a shoulder 11 of the wall 12 of the insertion opening.

A device for the detachable fastening of the service appliance in the mounting frame wall 9 is provided, by means of which device the service appliance can be fixed in the insertion opening. The device comprises a latch 20 which is formed from metal plating. Alternatively, however, the latch 20 may be a part injection-moulded from synthetic resin; it comprises a ridge 21 which merges into a detent 22 at the latch front and into an operating lever 23 at the latch rear. Side plates 24 are present on either side of the ridge 21, bent approximately perpendicularly therefrom and running mutually parallel. The side plates 24 are provided with bearing openings 25 through which bearing pins 26 of the side wall 1 are passed. A rotation bearing 27 about which the latch 20 can be pivoted is created in this manner.

The side plates 24 are provided with holder cavities 29 into each of which a latch spring 30 enters with a spring end 30a. The latch spring 30 exerts a force on the latch 20 in the direction of an arrow F, thus tending to pivot the latch into the position depicted in FIG. 1. The pivoting movement of the latch is limited here by a stop point 31 of an abutment 28.

The operational direction of the spring and the position of the holder cavity may be adapted to the circumstances. Thus the holder cavity 29a (broken lines) may be arranged farther away from the pivot point 27 in order to lengthen the lever arm. Similarly, opposed holders $29b_1$ and $29b_2$ for the latch spring 30 may be provided in various positions in order to modify the influence of the latch spring 30 on the latch lever 20. The latch spring 30 may, for example, also exert a force Fx on the holder cavity 29a when the one spring end 30a is in the holder cavity 29a and the other spring end 30b is supported in the opposed holder $29b_1$.

It is clear from FIG. 1 that the detent 22 then presses against the wail of the insertion opening. In this back-locking position according to FIG. 1, the latch 20 presses the service appliance in the mounting wall between the shoulder 11 and a retaining edge 13 of the wall 12 of the insertion opening. The service appliance is thus securely fixed in the mounting frame wall 9. The pressure force K can be varied through variation of the position of the holder cavity 29 relative to the bearing 27. It is possible through selection of the position of the holder cavity 29 to set the force gradient and the compression force K against the retaining edge 13 so as to be linearly rising, progressively rising, or substantially constant.

Figure 2:
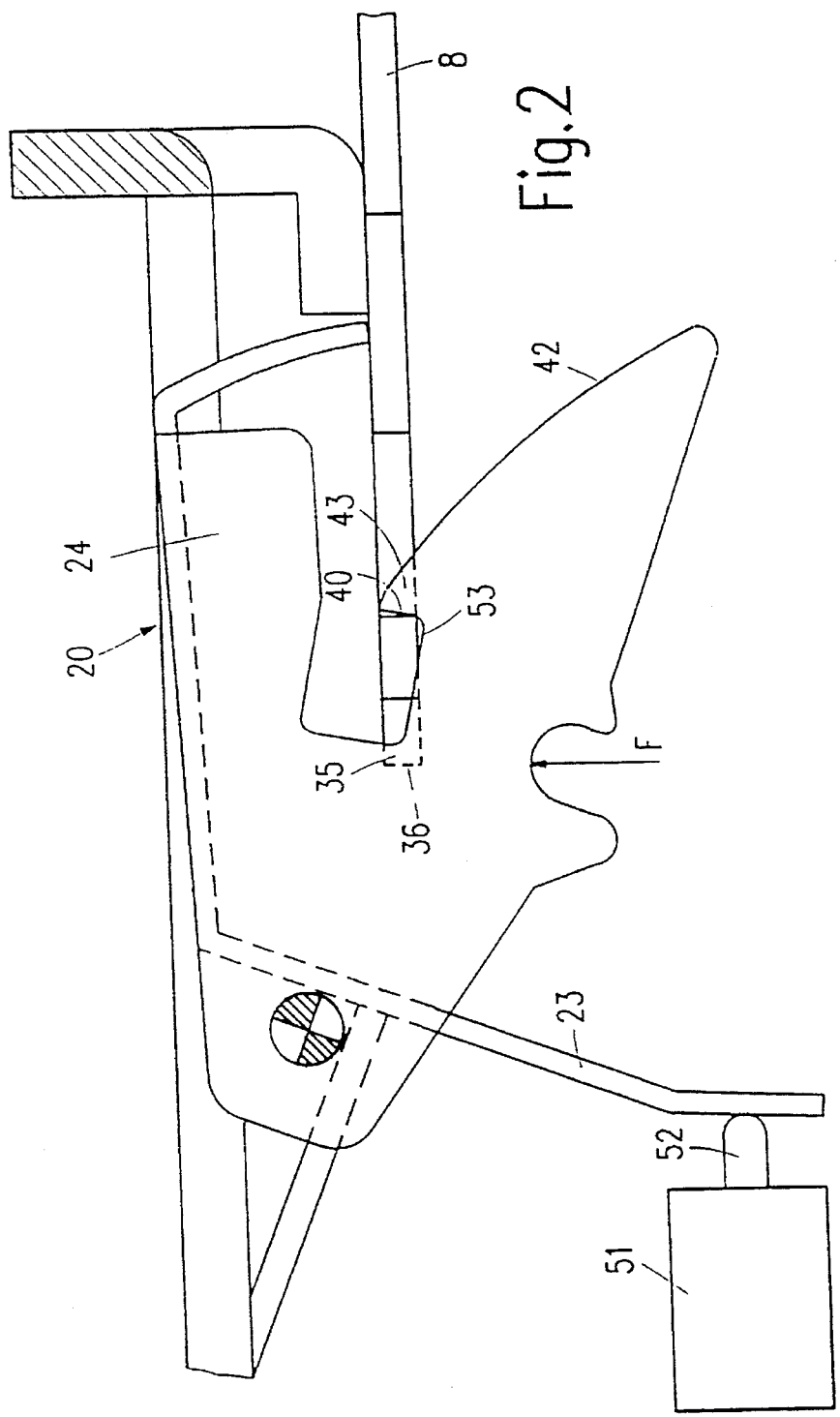
FIG. 2 shows the device with the latch pivoted into the release position, in which the appliance can be pulled from an insertion opening of the mounting frame wall.
Figure 3:
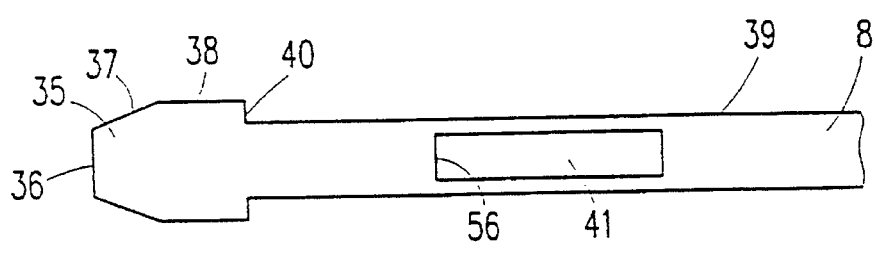
FIG. 3 shows an unlocking key in plan view.

The latch must be pivoted in clockwise direction for removing the service appliance from the mounting wall 9. This is done by means of the unlocking key 8. The appliance is provided with two latches 20, one at the fight-hand and one at the left-hand side wall 1. Accordingly, the substantially invisible slots 7, into each of which an unlocking key is inserted, are present in the front portion on the fight and on the left between the keys 6. Since the unlocking function and the unlocking mechanisms are the same on either side of the appliance, it is sufficient to describe only one latch 20 in its cooperation with an unlocking key 8. To clarify the function and the key, the latter is shown in plan view in FIG. 3, while FIG. 2 shows its operation in side elevation. The unlocking key 8 has a key head 35 which merges from its front edge 36 via guide surfaces 37 into a key bit portion 38. Between the key shaft 39 and the wider key bit portion 38 there is a retaining rim 40. An end position opening 41 is present in the key shaft 39.

When the unlocking key 8 is inserted into the slot 7, the key head 35 hits with its guide surfaces 37 against the curved edge 42 of the latch 20. The curved edges 42 have an arc-shape and constitute linearizing curves which control the pivoting movement of the latch 20 in such a manner that the unlocking forces are linearized within certain limits in order to avoid a strong increase in these forces. If the edge 42 had a straight shape, the unlocking forces would increase comparatively steeply.

When the unlocking key 8 is moved along the curved edge 42, as shown in FIG. 1, the guide surfaces slide over the curved edges of the two side plates 24, and the latch 20 pivots in clockwise direction until the retaining rims 40 drop behind the detent provided at the end of the curved edge. The unlocking key 8 thus hooks itself into the latch 20, which has been pivoted so far in clockwise direction in the position of FIG. 2 that it no longer hooks behind the effective region of the wall 12 of the insertion opening. With the unlocking keys 8 in the inserted and locked position, the service appliance may now be pulled out from the instrument panel, i.e. the insertion opening therein.

FIG. 1 shows a security code switch which is provided with an operating pin 52. In the back-locking position of the latch 20 according to FIG. 1, the operating lever 23 in the outward position shown makes no contact with the operating pin 52 of the security code switch 51. It is shown in broken lines in FIG. 1, however, that a movement in clockwise direction will bring the operating lever 23 into contact with the operating pin 52 in order to displace the latter. In the position shown in FIG. 2, the movement of the latch 20 in clockwise direction has also pivoted the operating lever 23 in clockwise direction, so that it has moved the operating pin 52 to the left. The security code switch 51, which is mounted to a circuit board of the appliance, has thus activated the security code of the appliance in accordance with the circuit provided. This is particularly important because the security code activation for appliances with high output powers, which is usually effected by means of the voltage drop, requires several seconds because of the discharging time of the capacitors. When the security code switch 51 already activates the security code during pivoting of the latch 20, this period of uncertainty is eliminated.

As described above, the unlocking key 8 is held behind the detent 43 at the end of its insertion path, which detent demarcates the curved edge in the insertion direction of the key 8. The key thus lies in a locking cavity 53 in FIG. 2. After the appliance has been removed from the mounting frame wall, accordingly, the two keys 8 are fixed in the appliance and must be removed from the appliance when the latter is to be inserted again.

Figure 4:
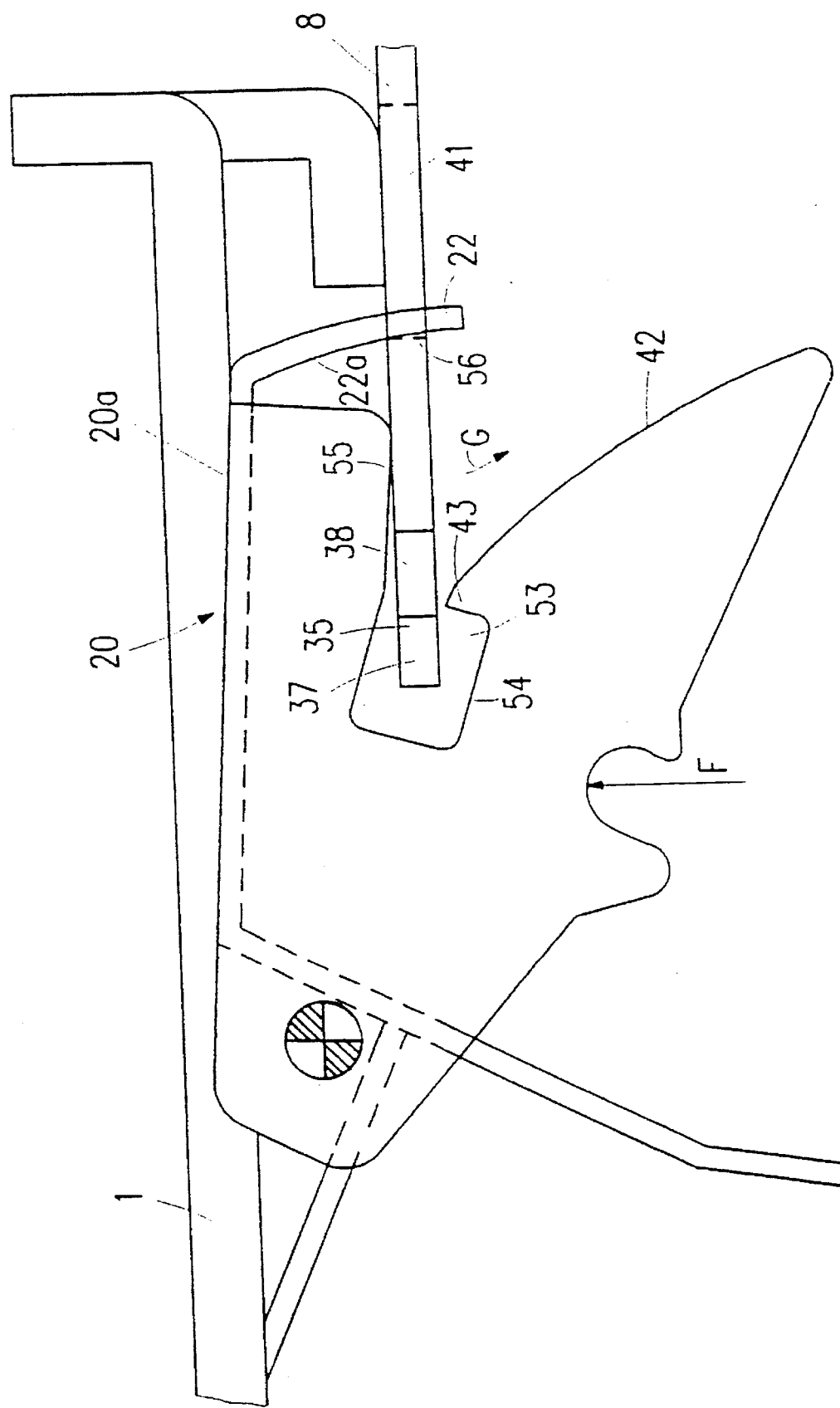
FIG. 4 shows the device with the latch pivoted into its end position in order to be able to remove the unlocking key from the appliance.

The removal of the key 8 takes place as follows in the configuration with the end-position opening 41 in the key and with the long detent 22. The two latches 20 are in the removal position according to FIG. 2. The two keys 8 lie with their retaining rims 40 against the detent 43. The latches 20 are consecutively brought into an end position as shown in FIG. 4 through a pressure of the hand on the surface 20a. The detents 22 then drop into the end-position opening 41 of the key 8. This releases the retaining rims 40 of the keys from the detent 43, and the keys can be pulled against the lower side 22a of the detent 22 until contact is made with edge 56. Now the latches are released and are no longer inside the locking ranges of the keys. The keys may now be fully pulled from the appliance. The latches return into their rest position of FIG. 1 during this. The curved edge 42 lays itself against abutment 31 again.

Figure 5:
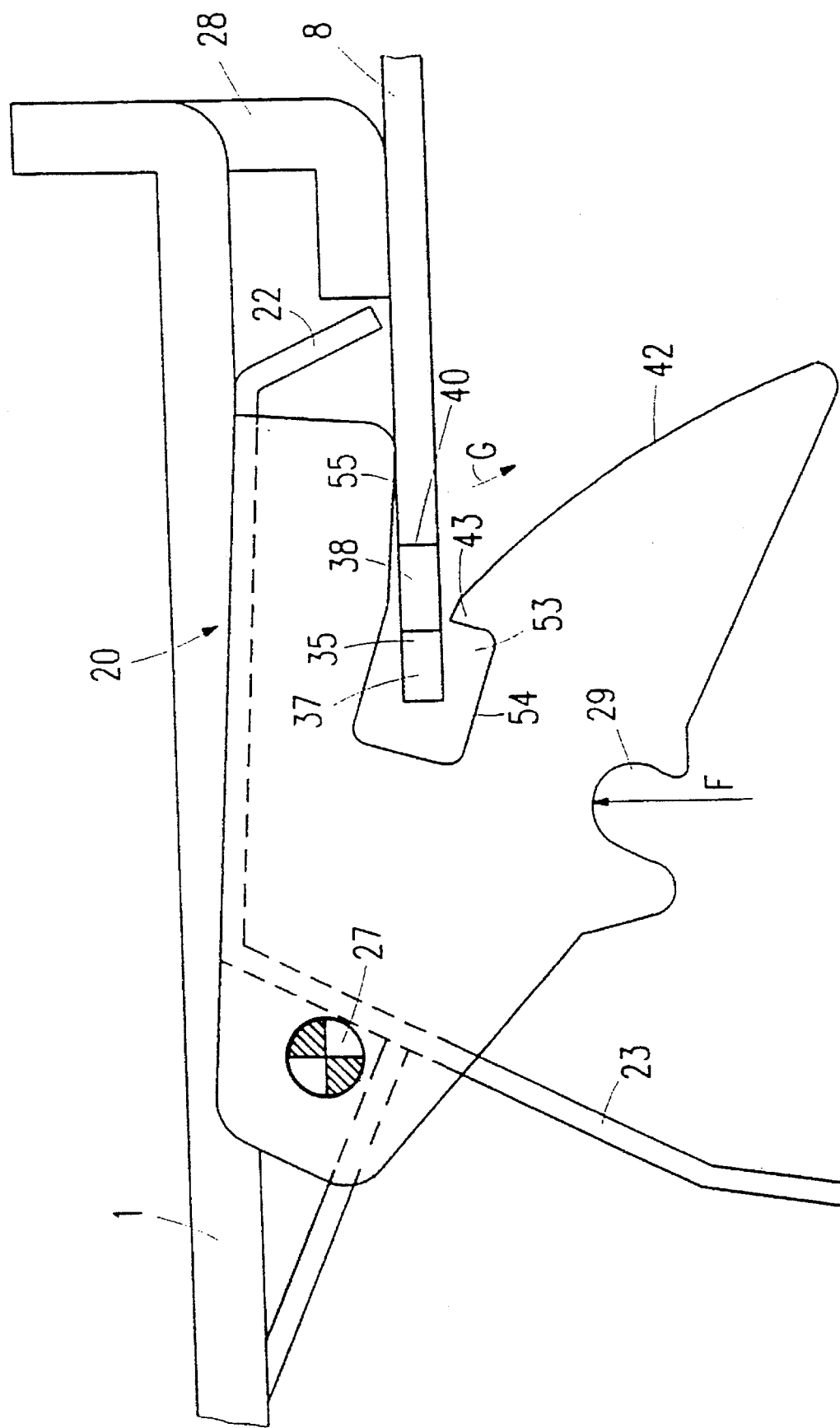
FIG. 5 shows the device with a modified key shape, while the latch is pivoted into the end position.

In the configuration of FIG. 5, the key 8 has no end-position opening. The detent 22 is steeper and shorter. Key removal then takes place as follows: the starting position is again as in FIG. 2, but with a shorter, steeper detent 22 according to FIG. 5. The appliance is taken out, the keys are in the appliance. There is a void between the keys and the detents 22 up to the end position. The latches 20 are consecutively pressed against the key 8 consecutively (see FIG. 5). The keys 8 will be released with their retaining rims 40 from the detents 43 and can be pulled from the appliance. This construction is easier to handle, but is more critical as regards mounting tolerances in the mounting frame wall.

We claim:

1. An apparatus comprising an electrical service appliance including fastening means for detachably fastening the appliance in an opening defined by a mounting means, said fastening means comprising:
   a. latching means insertable in the opening and pivotable to a locked position, for preventing removal of the appliance, or to a release position, for permitting removal of the appliance, said latching means including an inclined surface;
   b. spring means for forcing the latching means into the locked position;
   said apparatus including means defining a slotted passage for receiving a key and for guiding said key to the inclined surface of the latching means, said passage being oriented relative to said inclined surface to guide the key into sliding contact with said surface to effect pivoting of the latching means to the release position;
   said latching means including a projection which is positioned and shaped for entry into a predetermined portion of the key which defines a cooperating security opening that is positioned and shaped to receive said projection, thereby permitting pivoting of the latching means to the release position.

2. An apparatus as in claim 1 where the latching means defines a cavity located adjacent the inclined surface for receiving and holding an appendage of the key.

3. An apparatus as in claim 1 where the latching means includes a lever for effecting the making of an electrical connection when said latching means is pivoted to a predetermined one of said positions.

4. An apparatus as in claim 1 where the spring means has a first end disposed for pushing against a fixed part of the apparatus and has a second end disposed for pushing against a part of the latching means.

5. An apparatus as in claim 1 where the passage comprises a slot.

6. An apparatus as in claim 1 where the appliance comprises a car radio.

7. An apparatus as in claim 1 where the appliance comprises a compact disc player.

8. An apparatus as in claim 1 where the appliance comprises a cassette player.

9. An apparatus as in claim 1 where the appliance comprises an amplifier.

10. An apparatus as in claim 1 where the appliance comprises a traffic control unit.

11. An apparatus as in claim 1 where the mounting means comprises an instrument panel of a vehicle.

* * * * *